(12) United States Patent
Tsui et al.

(10) Patent No.: US 7,863,777 B2
(45) Date of Patent: Jan. 4, 2011

(54) LOW POWER SWITCHING CIRCUIT

(76) Inventors: Gallen Ka Leung Tsui, 17 Sheard Avenue, Brampton, Ontario (CA); Philip Y. W. Tsui, 17 Sheard Avenue, Brampton, Ontario (CA)

( * ) Notice: Subject to any disclaimer, the term of this patent is extended or adjusted under 35 U.S.C. 154(b) by 75 days.

(21) Appl. No.: 12/267,371

(22) Filed: Nov. 7, 2008

(65) Prior Publication Data

US 2009/0224612 A1 Sep. 10, 2009

Related U.S. Application Data

(60) Provisional application No. 61/034,055, filed on Mar. 5, 2008.

(51) Int. Cl.
*H01H 47/00* (2006.01)
(52) U.S. Cl. .................................................. 307/139
(58) Field of Classification Search ................. 307/139
See application file for complete search history.

(56) References Cited

U.S. PATENT DOCUMENTS

| | | | | |
|---|---|---|---|---|
| 3,470,436 A | * | 9/1969 | Steele | 318/799 |
| 3,596,158 A | * | 7/1971 | Watrous | 318/809 |
| 3,925,688 A | * | 12/1975 | Kalfus | 327/452 |
| 4,155,015 A | | 5/1979 | Nakasone et al. | |
| 4,232,258 A | * | 11/1980 | Matsumura | 388/830 |
| 4,322,632 A | * | 3/1982 | Hart et al. | 307/41 |
| 4,354,120 A | * | 10/1982 | Schornack | 307/132 E |
| 4,426,615 A | | 1/1984 | Hannas | |
| 4,521,843 A | | 6/1985 | Pezzolo et al. | |
| 4,560,909 A | * | 12/1985 | Peil | 315/291 |
| 4,580,403 A | * | 4/1986 | Hummel | 62/171 |
| 4,629,946 A | * | 12/1986 | Amano et al. | 315/219 |
| 4,634,957 A | * | 1/1987 | Hollaway | 323/242 |
| 4,651,022 A | * | 3/1987 | Cowley | 307/116 |
| 4,672,232 A | * | 6/1987 | Schoen | 307/140 |
| 4,716,409 A | * | 12/1987 | Hart et al. | 340/825.22 |
| 4,992,709 A | * | 2/1991 | Griffin | 318/249 |
| 5,041,825 A | * | 8/1991 | Hart et al. | 340/3.4 |
| 5,091,677 A | * | 2/1992 | Bleich et al. | 315/360 |
| 5,365,154 A | * | 11/1994 | Schneider et al. | 318/103 |
| 5,481,452 A | * | 1/1996 | Simmons | 700/12 |
| 5,504,400 A | * | 4/1996 | Dalnodar | 315/291 |
| 5,541,584 A | * | 7/1996 | Mehta et al. | 340/825.57 |
| 5,579,192 A | * | 11/1996 | Lee | 361/18 |
| 5,909,365 A | * | 6/1999 | Merwin et al. | 363/89 |
| 6,010,310 A | * | 1/2000 | MacBeth | 417/44.1 |
| 6,933,686 B1 | * | 8/2005 | Bishel | 315/293 |
| 2004/0027111 A1 | * | 2/2004 | Lee | 323/288 |

OTHER PUBLICATIONS

Canadian Search Report and Written Opinion dated Feb. 26, 2009.

* cited by examiner

*Primary Examiner*—Jared J Fureman
*Assistant Examiner*—Adi Amrany
(74) *Attorney, Agent, or Firm*—Dickstein Shapiro LLP

(57) ABSTRACT

A method and apparatus are provided for operating a wall switch module using leakage current. In one embodiment, the wall switch module may be operable using leakage current. The wall switch control module may be provided to include a microcontroller, wireless receiver and triac. The wall switch control module may be configured to control power applied to a load. In another embodiment, one or more signals received by the wireless receiver may be useable to control power applied to a load coupled to the wall switch control module. According to another embodiment, the wall switch control module may be useable for home automated systems.

26 Claims, 5 Drawing Sheets

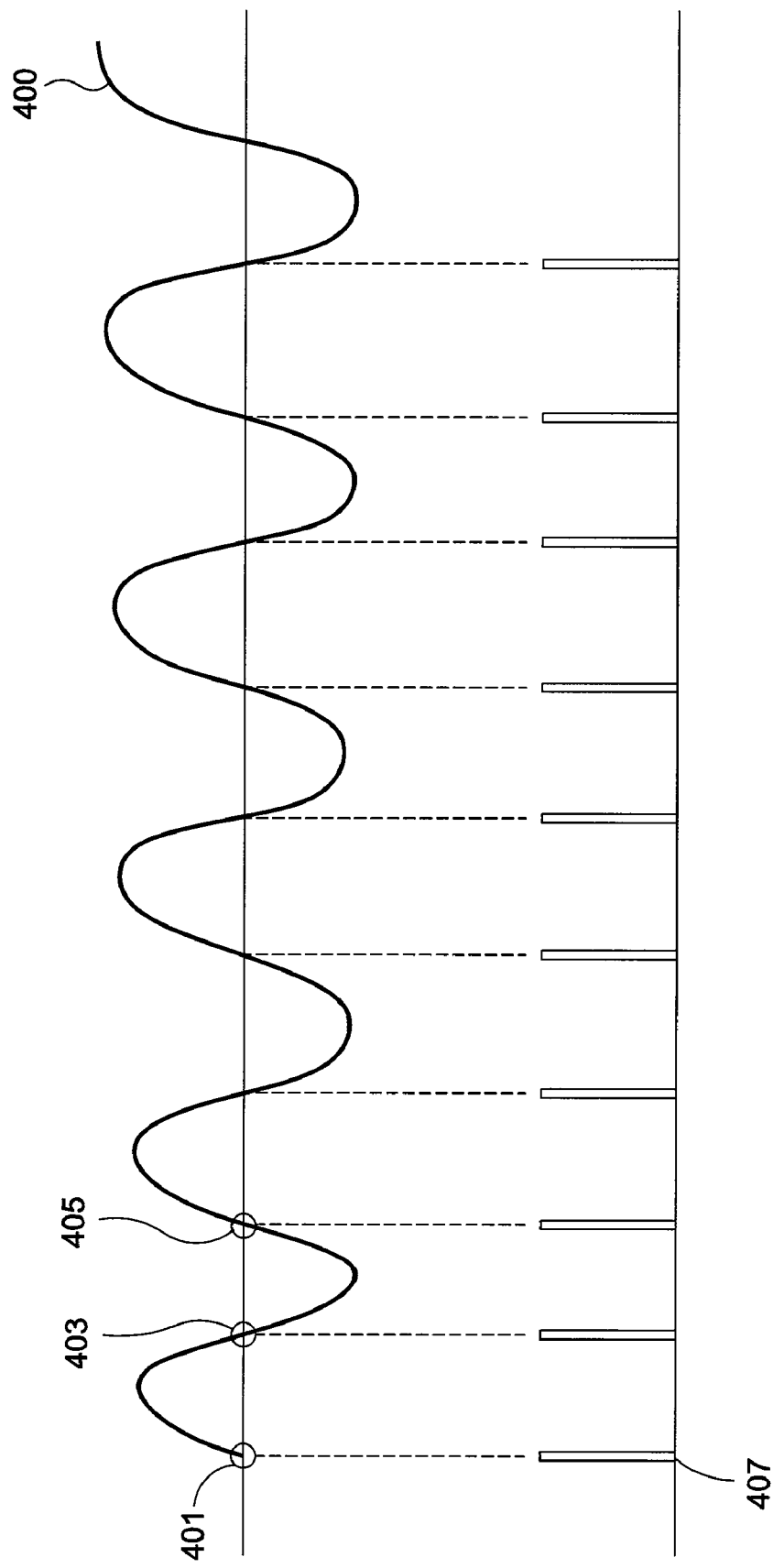

LOW POWER SWITCHING CIRCUIT

CROSS REFERENCE TO RELATED APPLICATION

This application claims the benefit of U.S. Provisional Application No. 61/034,055, filed Mar. 5, 2008.

FIELD OF THE INVENTION

The invention relates generally to a very low power switching circuit and more particularly to an apparatus and method of operating a wall switch module using leakage current.

BACKGROUND

Home automation systems have been developing for many years. Conventional applications for such systems include control of lighting, heating ventilation air conditioning (HVAC), garden sprinklers, intelligent alarm systems etc. Wireless home automation systems have gained popularity in recent years due to the relative ease of installation in comparison to many hardwired systems. Many wireless home automation systems are aimed at do-it-yourself customers since such wireless devices need wiring for power. The most popular application for wireless home automation system is lighting control. Among lighting control devices, wall switch controlled lighting devices are the most popular. These switches are widely used in both residential and commercial buildings alike. A conventional method for converting a traditional wall switch to be controlled wirelessly requires a wall switch module. Such wall switch modules can replace existing wall switches.

For a conventional wall switch module, power may be supplied by existing wiring in an electrical switch box. Generally, only 2 wires are fed into an electrical switch box—a live feed from the AC power supply to the switch and a wire extending from the switch to the load. In most cases, the other side of the load is connected directly to the neutral of the AC power supply without returning to the switch box. FIG. 1 illustrates a circuit diagram of a typical wall switch 101. As shown in FIG. 1, switch 101 is connected to the live terminal 103 of an AC power supply, the other end of the switch 101 is connected to load 105, in this instance a light bulb. Neutral 107 is connected to the other side of load 105 and is not located inside the wall switch box. Most electrical systems include an earth ground connection 109 to the electrical switch box containing the switch 101, mainly for safety considerations and to satisfy electrical code requirements.

Conventionally, electrical switch boxes may be provided with only a live feed to supply the wall switch. Further, a neutral connection is not provided to complete the circuit with the electrical switch box. It may be very costly to run a neutral connection back to the electrical switch box when a neutral wire is not initially installed due to limited access to the existing wiring. Therefore, there is a need for a wall switch module that can operate using existing wiring in an electrical switch box, even without a neutral connection.

Conventional attempts to provide lighting control products for wall switch control without a neutral connection are available, but limited in operation. One conventional approach is based on a wall switch module simulating a load, wherein the load changes depend on the status of the connected load. For example, when a lighting fixture is off, the wall switch internal loading may become very high resulting in increased power consumption at the wall switch internal load which causes the lighting fixture to be off. However, if the lighting fixture is turned on, the wall switch internal load may decrease and result in enough power to turn on the fixture. One major limitation with this approach is that the actual connected load must be incandescent loading, such as a tungsten light bulb. This conventional method will not work with compact fluorescent lamps (CFL) or fluorescent light. CFL exhibit very high impedance requiring higher levels of operating current than incandescent lamps. Conventional wall switch control devices and methods without a neutral connection do not provide enough current to operate CFL. Further, CFL typically requires less energy than traditional tungsten bulbs. In addition, some countries have proposed rules that with ban tungsten bulbs from the marketplace in the near future. Therefore, there is a need for a wall switch control module that overcomes one or more of the aforementioned drawbacks.

BRIEF DESCRIPTION OF THE DRAWINGS

FIG. 4 is a graphical representation of triac activation according to one embodiment of the invention;

DETAILED DESCRIPTION OF THE EXEMPLARY EMBODIMENTS

Figure 1:
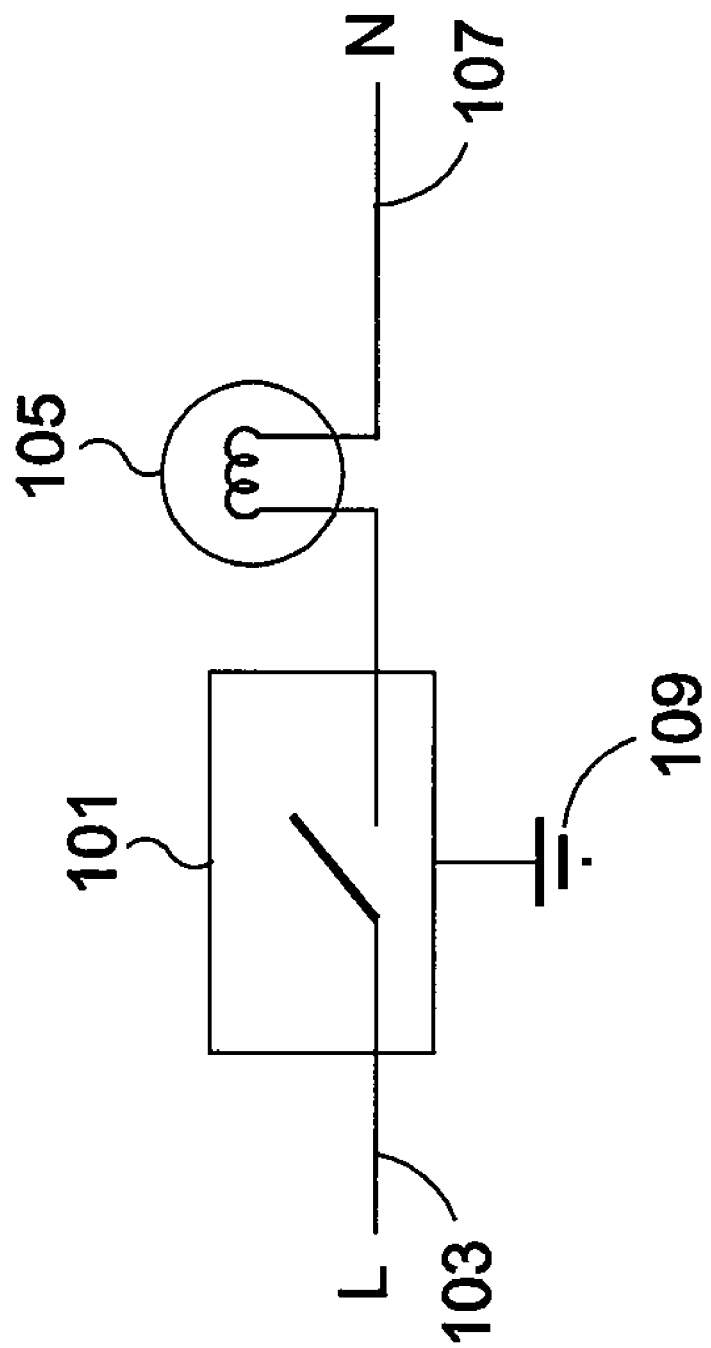
FIG. 1 is a circuit diagram of a conventional wall switch.

On aspect of the present invention relates to a very low power switching circuit configured to switch loads such as building lighting circuits and HVAC circuits. In one embodiment, a wall switch control module may be provided having a very low power consumption circuit and a rectifier network. The wall switch control module may be configured to receive and operate with leakage current conducted between a live and the ground connection for converting AC electrical power to a DC electrical power. In one embodiment, the wall switch control module may include a triac to control loading in order to minimize the total current consumption and/or control the power output level. According to another embodiment, the wall switch controller can include a storage capacitor coupled to the DC electrical power supply, for storing electrical power to operate the rest of the circuitry.

Current consumption for the triac may be less than a conventional latching relay, therefore capacity requirements for the storage capacitor may be less then a capacitor employed for a latching-relay-type wall switch controller. In fact, one aspect of the disclosure is the realization of several disadvantages of a latching relay in comparison to a triac. In particular, in addition to that the power consumption to activate a latching relay is generally higher than a triac, latching relays are also not able to provide rapid continuous activations due to the fact that the charging current is less than the consuming current. It may also be impossible to control the power output level for incandescent loads using latching relays, which also tend to be more costly than triacs.

In another embodiment, a wall switch control module may be provided for wireless home automation. The wall switch control module may include a radio frequency receiver and microprocessor in order to receive and process wireless commands. Further, the radio frequency receiver may be operable with very low operating current. The microcontroller can decode received wireless signals to determine required actions and control a triac for activating and/or controlling various types of connected loads.

According to another embodiment of the invention, the triac can be controlled without zero crossing detection, such that the triac will be turned on continuously with the same duration when a connected load stays on. In that fashion, turning on the triac without zero crossing detection may simplify circuitry for the wall switch control module. To that end, zero crossing detection is not necessary. Operation of the triac may be similar to activating a relay. However, the current consumption of a relay is much higher than a triac, requiring current approximately 5 times higher in magnitude. Therefore, in order to provide a low power consuming wall switch control module, a relay may not be employed.

According to another embodiment, the triac of a wall switch control module may be activated using zero crossing detection. The microcontroller can activate, or turn on, the triac after each zero crossing, once in every half AC cycle. For example, for a 60 Hz AC voltage, the triac could be activated once every 1/120 second. According to another embodiment, the triac may only required to be activated for a fraction of second. Time require for activation of the triac may be less than the time required to activate a latching relay. In that fashion, overall power consumption to activate a triac with zero crossing detection can be less than a latching relay.

According to another embodiment, controlling the triac with a microcontroller may be advantageous for controlling the overall output power for an incandescent load, such as a tungsten light bulb. The activation angle of the triac, the time delay after zero crossing, may be controlled by a phase control circuit which comprises a microcontroller, triac and zero crossing detection circuit. Different activation angles can generate different output power for the incandescent load. For a tungsten light bulb, different output power may translate to various brightness levels of the light bulb, which may be an important feature for lighting control. When the triac is activated at the beginning of every half cycle, maximum output power can be provided and the light bulb will be at the brightest level. If the triac is activated almost at the end of every half cycle, minimum power can be provided and therefore the brightness of the bulb will be at the lowest level.

According to another embodiment of the invention, lighting automation may be provided without the use of a timer to limit the loads to stay on for a fixed period of time. Lighting automation may be controlled with a remote controller and may provide continuous and rapid on/off operation of lights. In one embodiment, the storage capacitor may be capable of providing enough power to activate load requirements. A switch control module triac can consume much less current than conventional latching relays. To that end, employing a triac for a switch control module may be ideal for applications where the loads may be continuously and rapidly activated.

Figure 2:
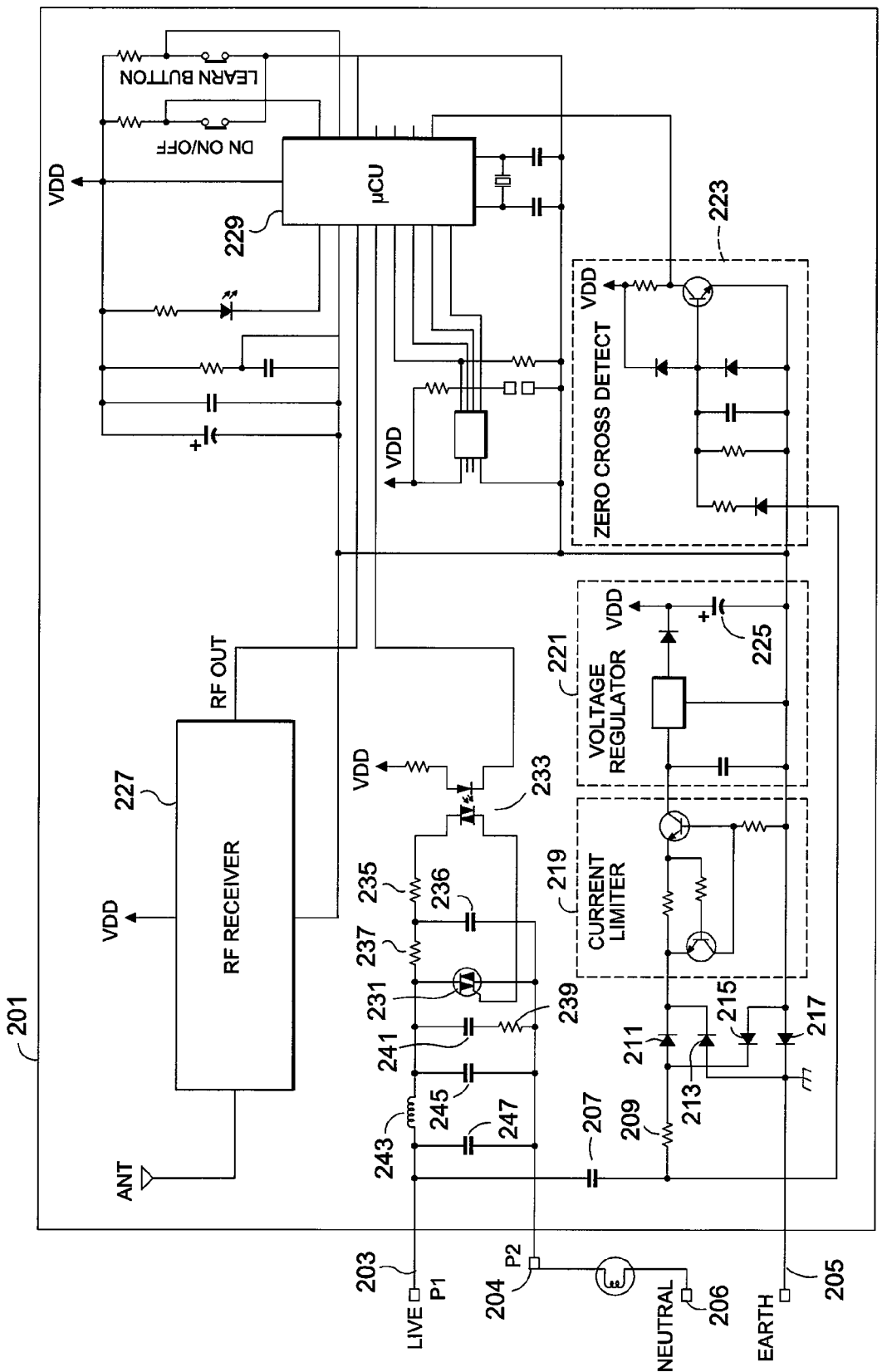
FIG. 2 is a circuit diagram of a wall switch control module according to one embodiment of the invention.

Referring now to the figures, FIG. 2 depicts a wall switch control module 201 according to one embodiment of the invention. As shown in FIG. 2, wall switch control module 201 includes terminals 203, 204 and 205. Wiring requirements for wall switch control module 201 may be identical to a conventional wall switch, such as wall switch 101. As such, wall switch control module 201 may be coupled to a conventional electrical switch box. Input terminal 203 may be coupled to a live conductor of an AC power supply. According to one embodiment, a return path may be provided to the earth ground connection terminal 205. Thereby providing a maximum conducted leakage current between the live and the ground connection, terminals 203 and 205, may be limited by capacitor 207 and resistor 209. According to another embodiment, wall switch control module 201 may include a bridge rectifier provided by diodes 211, 213, 215 and 217 usable to convert the power supply voltage from AC to DC. The rectifier may be coupled directly to earth ground terminal 205 in the wall switch box, such as conduit or the switch box itself. The output of the bridge rectifier can be approximately 12V DC. It should also be appreciated that the bridge rectifier may be configured to provide other voltages to facilitate operation of various components for the wall switch control module 201.

According to another embodiment, a current limiting circuit 219 may be used to control the amount of conducted current under various conditions, such as voltage fluctuations. The voltage provided by current limiter 219 may be regulated by voltage regulator 221 based on operating voltage levels required for at least one of microcontroller 229, radio frequency receiver 227 and triac 231. According to another embodiment, a zero crossing detection circuit 223 may be used to detect the zero crossing of the AC signal at every AC cycle. Zero crossing detection signals provided by zero cross detection circuit 223 may be provided to microcontroller 229. According to one embodiment, zero cross detection circuit 223 may be optional as wall switch control module may continuously operate triac 231 as discussed above. Received zero cross detection signals may be analyzed by the microcontroller 229 to control activation of triac 231. Activation of triac 231 at a desired phase angle can result in different power output levels for load 206, wherein load 206 relates to at least one of a CFL, incandescent load, tungsten bulb and lighting device in general. It should be appreciated that wall switch control module 201 control at least one of an HVAC device, sprinkler controller and any home automation device in general.

According to another embodiment, wall switch control module 201 may include a snubber circuit for protection of triac control circuitry. The snubber circuit of wall switch control module 201 may include capacitors 236 and 241, and resistors 235, 237, 239 arranged as shown in FIG. 2. Wall switch control module 201 may further include inductor 243 and capacitors 245 and 247 arranged to provide a noise filter useable to filter AC signal noise generated by activating triac 231.

According to another embodiment, a storage capacitor 225 may be used to store power required by circuitry of wall switch control module 201 including operation of radio frequency receiver 227, microcontroller 229, activation of triac 223, etc. Charging current for capacitor 225 may be limited by current limiter 219. According to one embodiment, the charging current should be higher than the discharge current for continuous activations of triac 231. As such, load 206 coupled to wall switch control module 201 can be operated continuously and rapidly. Radio frequency (RF) receiver 227 may be useable to receive wireless signals including commands from a remote control (not shown). It may be appreciated that RF receiver may be configured to operate with at least one wireless protocol such as Z-wave, Zigbee, Insteon, or any other wireless home automation protocol in general. RF receiver 227 may be coupled to microcontroller 229 to provide one or more received signals to microcontroller 229 for processing. For example, microcontroller 229 can determine whether a received signal is a valid command and determine the operation indicated by the command. Received commands may relate to switching power to off for the load, applying power to the load and/or changing the power output level. In that fashion, microcontroller 229 can control triac 231 through an optical coupler 233, which can provide optical isolation between the DC circuitry and the AC control circuitry in order to meet safety requirements. Wall switch control module 201 can control triac 231 in a plurality of ways in order to activate connected load 206. In one embodiment, triac 231 can be activated continuously without the need for zero crossing detection as will be discussed in more detail with respect to FIGS. 3A-3B. Alternatively, triac 231 can be activated based, at least in part, on zero crossing detection as will be discussed in more detail with respect to FIG. 4.

Thus, one aspect of the disclosure is to provide an improved wall switch (e.g., wall switch control module 201) operated by leakage current, which has the advantage of using a triac control, and which can operate on various different types of loads, including incandescent loads, fluorescent loads, CFLs, motor loads, and so on.

Figure 3A:
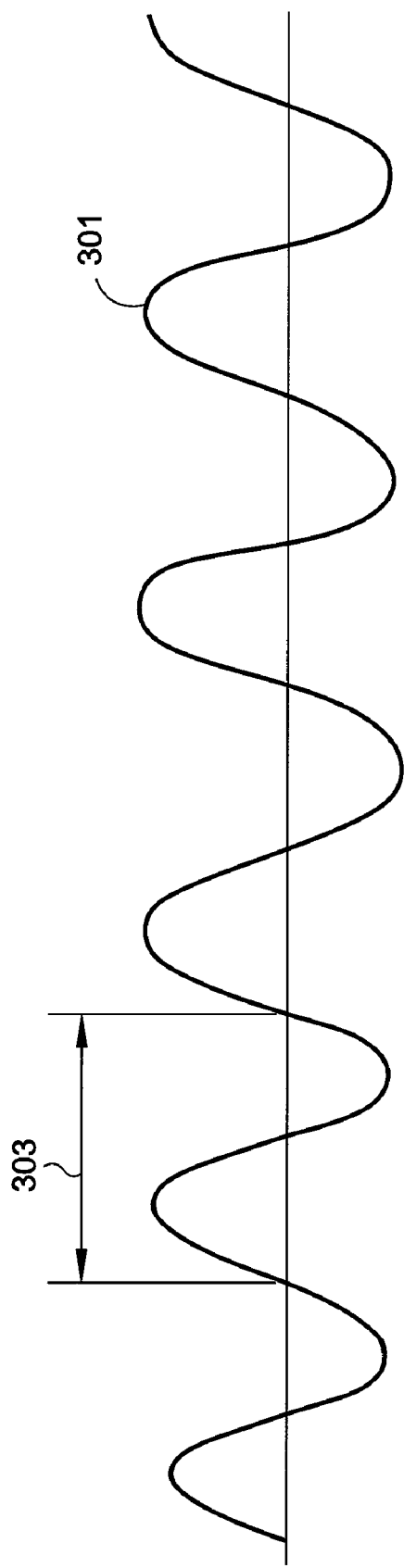
FIG. 3A is a graphical representation of AC line voltage which may be applied to the wall switch control module of FIG. 2 according to one embodiment of the invention.
Figure 3B:
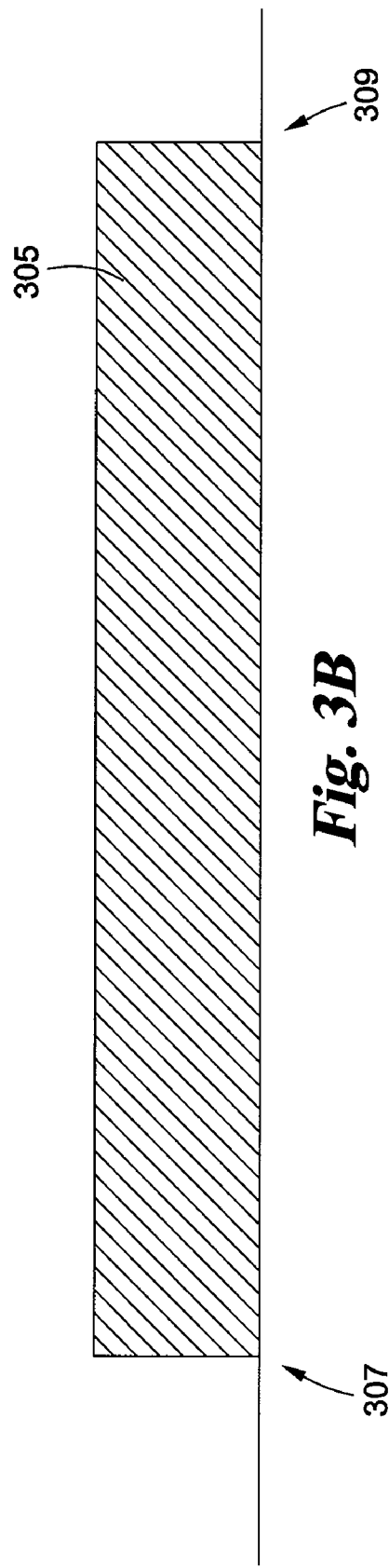
FIG. 3B is a graphical representation of triac activation according to one embodiment of the invention.

Referring now to FIG. 3A, AC signal 301 is shown which can be received by the live terminal (e.g., terminal 203) of a wall switch control module (e.g., wall switch control module 201). As shown in FIG. 3A, AC signal 301 exhibits a period 303 of 1/60 of a second and relates to signal frequency of 60 Hz. It should be appreciated that AC signal 301 may relate to other frequencies which may be carried by a feed coupled to terminal (terminal 203). In order to activate a triac (e.g., triac 231) without detecting zero crossings, the triac can be turned on continuously for the entire duration that power is applied to a load (e.g., load 206). FIG. 3B depicts a graphical representation of triac activation, shown as 305, for a duration indicated by reference indicators 307 to 309. Indicator 307 represents initiation of triac activation which may coincide with application of power to a load by the wall switch control module. Indicator 309 represents an end to triac activation and may coincide with removal of power from a load. An advantage of continuously activating the triac may be that zero crossing detection is not required. Thus, overall circuitry and operation of a wall switch control module may be simplified according to one or more embodiments of the invention.

According to another embodiment of the invention, a wall switch control module (e.g., wall switch control module 201) can control power output to a load, such as changing the brightness of an incandescent load and/or any type of lighting load in general. In yet another embodiment, current consumption of the wall switch control module may be reduced by detecting zero crossings of a received AC signal. Zero crossing detection may relate to detecting a zero voltage level for every cycle of an AC signal. According to another embodiment of the invention, controlling a triac to turn on after every detected zero crossing can provide control of power output to a load.

Referring now to FIG. 4, a graphical representation depicting received AC line voltage 400 and triac activation pulse 407 are shown according to one embodiment of the invention. As shown in FIG. 4, AC line voltage 400 is shown which can be received by a terminal (e.g., terminal 203) of a wall switch control module (e.g., wall switch control module 201). According to one embodiment, the wall switch control module can activate a pulse 407 after detecting the zero crossing half cycle, indicating as 401, 403, and 405. Activation pulse 407 may be characterized as having a duration of approximately 100 μs, (i.e., 0.0001 seconds). The current consumption required to activate the triac (e.g., triac 231) may relate to approximately 10 mA for each activation pulse 407 having a duration of 100 μs. The amount of power required to activate a plurality of pulses for extended periods of time may be insignificant as the current consumption for triac controlled activation may be significantly less than the charging current. According to another embodiment, in order to reduce the current consumption further, activating the triac after every half crossing cycle may be provided according to one or more embodiments of the invention.

Zero crossing detection may be important in order to reduce overall power consumption, as well as to control the power output level for incandescent loads. In one embodiment, activating a pulse after every zero crossing can provide a maximum output level for a wall switch control module (e.g., wall switch control module 201). According to another embodiment, the pulse can be activated with delay after a zero crossing in order to reduce the output power level of a wall switch control module.

Figure 5A:
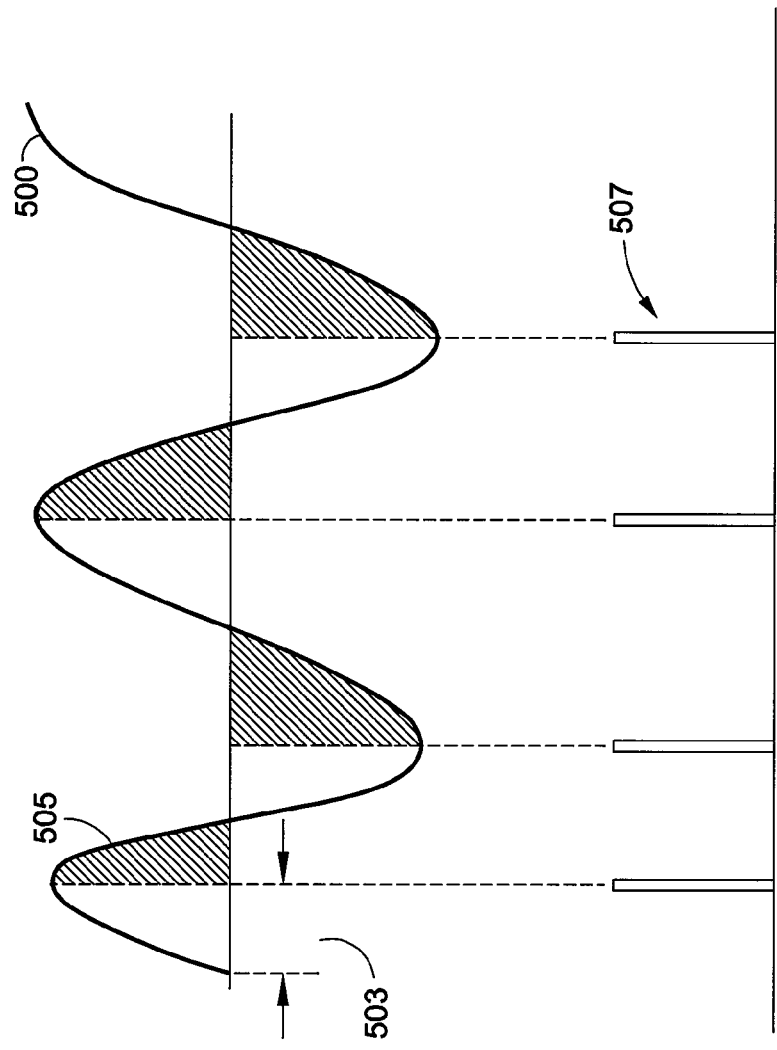
FIG. 5A is a graphical representation of AC line voltage which may be applied to the wall switch control module of FIG. 2 according to one embodiment of the invention.
Figure 5B:
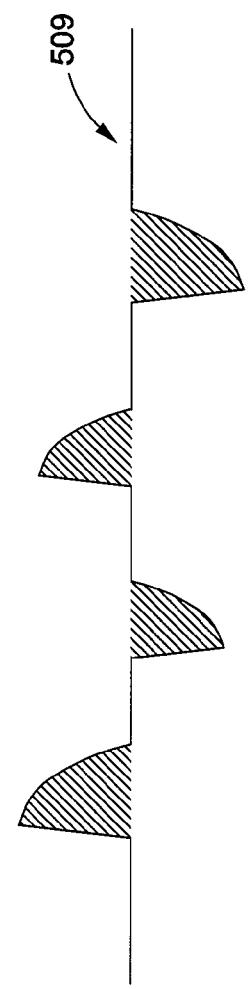
FIG. 5B is a graphical representation of output power according to one or more embodiments of the invention.

Referring now to FIGS. 5A-5B, graphical representation is provided for activation pulses generated by a triac (e.g., triac 231) according to one embodiment of the invention. As illustrated in FIG. 5A, a triac of a wall switch control module (e.g., wall switch control module 201) can activate a pulse 507 with time delay 503 at the middle 505 of every half cycle of a received AC signal 501. Power output 509 by the wall switch control module is shown in FIG. 5B. It may be appreciated that power of 509 may be reduced by 50% when pulse 507 is activated at the middle of every half cycle. To that end, the power output level of a wall switch control module can be determined by the delay following a zero crossing. Further, it may be appreciated that the longer the delay in the half cycle, the less output power it will generate for incandescent loading.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

What is claimed is:

1. A switch control module comprising:
   an input terminal coupled to an alternating current (AC) power supply;
   a ground terminal coupled to an earth ground;
   a load terminal configured to be coupled to a load;
   an electrical path configured to conduct a leakage current between the input terminal and the ground terminal;
   a triac circuit having a first terminal electrically coupled to the input terminal and a second terminal electrically coupled to the load terminal, and a gate terminal configured to receive a state triggering voltage; and
   a microcontroller electrically coupled to a direct current (DC) power source that is based on the leakage current, and wherein the microcontroller is further coupled to the gate terminal through which the microcontroller is configured to provide the state triggering voltage to the triac circuit.

2. The switch control module of claim 1, wherein the DC power source utilizes stored energy resulted from the leakage current.

3. The switch control module of claim 1, wherein the microcontroller is configured to provide the state triggering voltage to the triac circuit in response to a zero crossing detection signal received from a zero crossing detection circuit.

4. The switch control module of claim 3, wherein the zero crossing detection signal corresponds to one cycle of the AC power supply.

5. The switch control module of claim 3, wherein the zero crossing detection signal corresponds to half of one cycle of the AC power supply.

6. The switch control module of claim 1, wherein the triac, in response to the state triggering voltage, is to provide an activation pulse to the load.

7. The switch control module of claim 6, wherein the activation pulse includes a time delay equal to one half of one cycle of the AC power supply.

8. The switch control module of claim 1, wherein the microcontroller is further configured to provide the state triggering voltage to the triac circuit, responsive to the zero crossing detection signal, to control activation, of the triac at a desired phase angle to provide varying power output levels to the load.

9. A method for selectively delivering electrical power comprising the acts of:
  receiving, by an input terminal, alternating current (AC) power from an AC power supply;
  generating a leakage current between the input terminal and a ground terminal coupled to an earth ground;
  converting the leakage current to a direct current (DC) power source;
  providing a state triggering voltage, using the DC power source, to a triac circuit; and
  selectively providing the AC power to a load, via a load terminal, in response to said state triggering voltage.

10. The method of claim 9, wherein the DC power source utilizes stored energy resulted from the leakage current.

11. The method of claim 9, wherein providing the state triggering voltage comprises providing the state triggering voltage to the triac circuit in response to a zero crossing detection signal received from a zero crossing detection circuit.

12. The method of claim 11, wherein the zero crossing detection signal corresponds to one cycle of the AC power supply.

13. The method of claim 11, wherein the zero crossing detection signal corresponds to half of one cycle of the AC power supply.

14. The method of claim 9, further comprising providing, by the triac circuit, an activation pulse to the load in response to the state triggering voltage.

15. The method of claim 14, wherein the activation pulse includes a time delay equal to one half of one cycle of the AC power supply.

16. The method of claim 9, wherein selectively providing the AC power comprises selectively controlling activation of the triac circuit at a desired phase angle to provide varying power output levels to the load.

17. A control switch comprising:
  an input terminal coupled to an alternating current (AC) power supply;
  a ground terminal coupled to an earth ground;
  a load terminal configured to be coupled to a load;
  a means for generating a leakage current between the input terminal and a ground terminal coupled to an earth ground;
  a means for converting the leakage current to a direct current (DC) source;
  a means for providing a state triggering voltage using the DC power source; and
  a means for selectively providing the AC power to a load in response to said state triggering voltage.

18. The control switch of claim 17, wherein the means for providing the state triggering voltage using the DC power source comprises a means for providing the state triggering voltage using the DC power source to a triac circuit.

19. The control switch of claim 17, wherein the DC power source utilizes stored energy resulted from the leakage current.

20. The control switch of claim 17, wherein the means for providing the state triggering voltage comprises a means for providing the state triggering voltage in response to a zero crossing detection signal received from a zero crossing detection circuit.

21. The control switch of claim 20, wherein the zero crossing detection signal corresponds to one cycle of the AC power supply.

22. The control switch of claim 20, wherein the zero crossing detection signal corresponds to half of one cycle of the AC power supply.

23. The control switch of claim 17, wherein the means for selectively providing the AC power to the load further comprising means for providing an activation pulse to the load in response to the state triggering voltage.

24. The control switch of claim 23, wherein the activation pulse includes a time delay equal to one half of one cycle of the AC power supply.

25. The control switch of claim 17, wherein the means for selectively providing the AC power comprises means for selectively controlling activation of a triac circuit at a desired phase angle to provide varying power output levels to the load.

26. The control switch of claim 17, wherein the means for providing the state triggering voltage comprising means for controlling a triac circuit continuously while the load is on.

* * * * *